United States Patent
Kwag et al.

(10) Patent No.: US 6,232,228 B1
(45) Date of Patent: *May 15, 2001

(54) METHOD OF MANUFACTURING SEMICONDUCTOR DEVICES, ETCHING COMPOSITION FOR MANUFACTURING SEMICONDUCTOR DEVICES, AND SEMICONDUCTOR DEVICES MADE USING THE METHOD

(75) Inventors: Gyu-hwan Kwag, Suwon; Se-jong Ko, Hwasung-gun; Kyung-seuk Hwang, Suwon; Jun-ing Gil, Hwasung-gun; Sang-o Park, Osan; Dae-hoon Kim, Yongin; Sang-moon Chon, Sungnam; Ho-Kyoon Chung, Yongin, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/325,389

(22) Filed: Jun. 4, 1999

Related U.S. Application Data

(63) Continuation-in-part of application No. 09/109,922, filed on Jul. 2, 1998, now Pat. No. 6,140,233.

(30) Foreign Application Priority Data

Jun. 25, 1998 (KR) .................................. 98-24232
Aug. 3, 1998 (KR) .................................. 98-31544

(51) Int. Cl.[7] .................................................. H01L 21/44
(52) U.S. Cl. ........................ 438/669; 438/672; 438/685; 438/745; 438/748; 438/754; 216/88; 216/92; 216/100; 216/108; 216/109

(58) Field of Search .................................. 438/669, 672, 438/685, 745, 748, 754; 216/88, 92, 100, 108, 109

(56) References Cited

U.S. PATENT DOCUMENTS 5,279,704   1/1994   Saito .
5,486,234   1/1996   Contolini et al. .

*Primary Examiner*—John F. Niebling
*Assistant Examiner*—David A Zarneke
(74) *Attorney, Agent, or Firm*—Jones Volentine, LLC

(57) ABSTRACT

A method of manufacturing semiconductor devices is provided, including the formation of a conductive plug and the minimizing of the step-height of an interlayer dielectric layer. An etching composition is also provided for such a manufacturing method. The method of manufacturing semiconductor devices includes the steps of forming an insulating layer over a semiconductor substrate, forming contact holes in the insulating layer, forming a conductive layer over the insulating layer to burying the contact holes, rotating the semiconductor substrate, and etching the conductive layer by supplying an etching composition on the rotating semiconductor substrate, and spin-etching the tungsten layer using an etching composition such that the conductive layer remains only inside the contact holes and does not remain over the insulating layer. The etching composition includes at least one oxidant selected from $H_2O_2$, $O_2$, $IO_4^-$, $BrO_3$, $ClO_3$, $S_2O_8^-$, $KIO_3$, $H_5IO_6$, KOH and $HNO_3$, at least enhancer selected from HF, $NH_4OH$, $H_3PO_4$, $H_2SO_4$, $NH_4F$ and HCl, and a buffer solution, mixed together in certain amounts.

28 Claims, 15 Drawing Sheets

METHOD OF MANUFACTURING SEMICONDUCTOR DEVICES, ETCHING COMPOSITION FOR MANUFACTURING SEMICONDUCTOR DEVICES, AND SEMICONDUCTOR DEVICES MADE USING THE METHOD

This application is a Continuation-in-part application of "METHOD OF MANUFACTURING SEMICONDUCTOR DEVICES, ETCHING COMPOSITIONS FOR MANUFACTURING SEMICONDUCTOR DEVICES AND SEMICONDUCTOR DEVICES THEREBY, by Gyu-Hwan KWAG et al., Ser. No. 09/109,922, filed on Jul. 2, 1998, now U.S. Pat. No. 6,140,233, the contents of which are herein incorporated by reference in their entirety. This application also relies for priority upon Korean Patent Application No. 98-31544, filed on Aug. 3, 1998, the contents of which are herein incorporated by reference in their entirety.

BACKGROUND OF THE INVENTION

The present invention relates to fabrication processes for semiconductor devices. More particularly, the present invention relates to a method of manufacturing semiconductor devices for providing the formation of conductive lines or plugs by using tungsten, copper, polysilicon, and the like, and minimizing the step-height of interlayer dielectric layers by etching thin films on the semiconductor substrate using a specific etching composition and spin etching methods. The present invention also relates to an etching composition for manufacturing semiconductor devices, and semiconductor devices made by these processes.

Recently there has been an increased demand for fine pattern formation technology for semiconductor devices and the use of multi-layered circuit structures for semiconductor devices as they become more highly-integrated. In other words, the surface structures of semiconductor devices are becoming more and more complicated, to the point that the step-height between layers can cause malfunctions in the fabrication process of semiconductor devices.

In a photolithography process from among the various fabrication processing steps, a photoresist pattern is formed on the semiconductor substrate by coating a wafer with a photoresist. A mask having circuit-forming elements is aligned on the wafer, and an exposure process is carried out by irradiating the photoresist on the wafer with light.

Semiconductor devices with relatively large critical dimensions i.e., the smallest dimension to be fabricated, and a low-layered structure can cause a few problems. However, with the finer patterns and multi-layered structures currently used on semiconductor substrate, it is more difficult to exactly focus between the upper position and the lower position of the step-height between layers in the exposure process. As a result, precise pattern formation is hard to achieve.

Therefore, planarization methods for minimizing the step-height between layers have become more important. Various planarization methods such as silicon-on-glass (SOG) layer deposition, etch back, or reflow, etc. have been employed in order to overcome the above problems, but these methods have other problems associated with them. Another method for planarization is the Chemical Mechanical Polishing (CMP) method.

The CMP method has been developed as a planarization process that operates across the whole surface of the wafer. When the CMP method is applied to a semiconductor device manufacturing process, the removal rate and the uniformity of planarization are important CMP parameters.

In the case where a silicon dioxide ($SiO_2$) layer is planarized using an oxide layer CMP process, the property of the silicon dioxide ($SiO_2$) is changed into a hydrophillic subject to $H_2O$ permeability by the reaction with alkali slurry. Water intruded into the silicon dioxide ($SiO_2$) operates to disconnect the connection chains of the silicon dioxide ($SiO_2$). The silicon dioxide ($SiO_2$) is then removed by a physical mechanism through the use of an abrasive.

In the case where a metal layer is planarized using a CMP process, however, the chemical reaction on the surface of the metal layer by an oxidant inside the slurry creates a metal oxide layer. This metal oxide layer is removed by the mechanical (physical) friction of the abrasive with the uppermost layer of the uneven pattern.

FIG. 1 is a schematic representation showing the conventional CMP apparatus for manufacturing semiconductor devices.

Referring to FIG. 1, the CMP apparatus comprises, a polishing head 102, a polishing table 104, and a polishing pad 108. The CMP process is carried out on the polishing table 104. The polishing pad 108 is formed on the polishing table 104 and holds a semiconductor substrate 100. A slurry is then supplied from a slurry supply line 106 and is used to polish the semiconductor substrate 100. The polishing head 102 secures the semiconductor substrate 100 to the polishing pad 108 and is movable in a rotational direction.

The polishing pad 108 comes in contact with the semiconductor substrate 100 in the CMP process. The semiconductor substrate 100 is rotated by the polishing head 102, and the slurry is supplied on the polishing pad 108. The slurry and the surface of the semiconductor substrate 100 react with each other, which causes the semiconductor substrate 100 to be polished by the polishing pad 108.

FIGS. 2 to 7 are cross sectional views showing a manufacturing process for semiconductor devices in order to describe conventional processing sequences for forming a tungsten plug, including the use of a CMP process. Processes for forming both a tungsten plug portion and an align mark are shown simultaneously.

The semiconductor device shown in FIGS. 2 to 7 is divided into a cell portion (C), formed of components of electric circuitry, and a peripheral portion (P), formed of components of align marks, scribe lines, etc.

As shown in FIG. 2, an oxide layer 114 is formed as a dielectric layer on a semiconductor substrate 110 having a plurality of local patterns 112 formed apart from each other. The local patterns 112 can each include a polysilicon pattern or metal pattern as a conductive layer. The oxide layer 114 is a silicon dioxide layer ($SiO_2$) formed by a conventional Chemical Vapor Deposition (CVD) process, although a phosphosilicate (PSG) layer or a borophosphosilicate (BPSG) layer may also be used as a dielectric layer between the polysilicon pattern layers or between the metal layers. At this time, the oxide layer 114 is formed on both the cell and peripheral portions.

As shown in FIG. 3, the oxide layer 114, which is initially uneven because of the presence of the local pattern 112, is planarized using the CMP apparatus shown in FIG. 1 and described above.

As shown in FIG. 4, contact holes 116 are formed by a typical photolithography and etch process by coating the oxide layer 114 with a photoresist, forming a photoresist pattern, and then etching the oxide layer 114 using the photoresist pattern as an etch mask. At this time, a peripheral hole 118, used for an align mark or a scribe line, is formed in the oxide layer 114 in the peripheral region (P) with a diameter bigger than that of the contact holes 116.

As shown in FIG. 5, a dual titanium/titanium nitride (Ti/TiN) layer is formed on the whole surface of the oxide layer 114 as a barrier layer 120 before a tungsten layer is formed. The dual Ti/TiN barrier layer 120 includes a Ti layer 120a and a TiN layer 120b. The Ti layer 120a is formed using a conventional sputtering method or a CVD method, and the TiN layer 120b is formed using a typical sputtering method. The barrier layer 120 reduces the contact resistance of the tungsten layer, and improves the adhesiveness of the oxide layer 114 and the tungsten layer. In addition, during a later process for removing the tungsten layer, the barrier layer 120 is used as stopper layer. At this time, the barrier layer 120 is formed both over and in the contact holes 116 and the peripheral hole 118.

As shown in FIG. 6, a tungsten layer 122 is formed over the whole oxide layer 114 having a thickness sufficient to bury the contact holes 116 and at least partially fill the peripheral hole 118. The peripheral hole 118 has a bigger diameter than that of the contact hole 116 of the cell part, however, and so the peripheral hole 118 of the peripheral portion is not fully filled with the tungsten layer 122, but instead only has its bottom and sidewalls covered.

As shown in FIG. 7, the semiconductor substrate 110 having the tungsten layer 122 formed thereon is fixed on the polishing head 102 of the CMP apparatus of the FIG. 1, and the polishing pad 108 contacts with the tungsten layer 122 while the metal layer slurry is supplied from the slurry supply line 106. The polishing head 102 is then rotated to remove the upper portion of the tungsten layer 122 on the barrier layer 120 such that the lower portion of the tungsten layer 123 remains inside the contact holes 116. At this time, however, the lower portion of the tungsten layer 123 also remains on the bottom and sidewalls of the peripheral hole 118. The remaining tungsten layer 123 in the peripheral hole 118 (i.e. the align mark or scribe line) may later cause the generation of particles in a following photolithography process, thereby weakening the alignability of the photolithography process.

The tungsten plug formation process should typically be conducted after the planarization of the interlayer dielectric (ILD) layer. Therefore, when the CMP process is added to the planarization for the surface of the semiconductor wafer, the CMP process decreases the productivity of the manufacturing and increases the expense of the semiconductor device cost because of the short period allowed for the exchange of the polishing head and the slurry.

In addition, the dry each back process used during the formation of the tungsten plug increases the contact resistance and the worst electrical characteristics of the transistors because of the associated electrical charge-up of plasma.

Therefore, a demand has arisen to develop a method to address the above problems. We therefore provide a method to solve the above problems to improve efficiency and productivity of semiconductor devices manufacturing.

SUMMARY OF THE INVENTION

This invention provides a method of manufacturing semiconductor devices related to etch conductive layers or interlayer dielectric layers on a semiconductor substrate using spin-etching method by supplying an etching composition on a rotating semiconductor substrate.

Another object of this invention provides a method of manufacturing semiconductor devices by planarizing interlayer dielectric layers and forming conductive plugs without micro-scratches on the surface of semiconductor substrate to avoid an unnecessary increase of the contact resistance.

Another object of this invention provides an etching composition to etch the conductive layers or interlayer dielectric layers by spin-etching method.

In accordance with this invention, a method of manufacturing semiconductor devices is provided, comprising forming an insulating layer over a semiconductor substrate, forming contact holes in the insulating layer, forming a conductive layer over the insulating layer to burying the contact holes, rotating the semiconductor substrate, and etching the conductive layer by supplying an etching composition on the rotating semiconductor substrate. The etching composition preferably comprises a mixture of at least one oxidant selected from the group consisting of $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group consisting of HF, $NH_4OH$, $H_3PO_4$, $H_2SO_4$, $NH_4F$, and HCl, and a buffer solution. The oxidant, the enhancer, and the buffer solution preferably have a mixing ratio such that after the etching, the material of the conductive layer is only present inside the contact hole and does not remain over the insulating layer.

The buffer solution may comprise deionized water. The conductive layer may comprise a material selected from the group consisting of tungsten (W), copper (Cu), and polysilicon.

The method may further comprise forming a barrier metal layer over the semiconductor substrate and the insulating layer, after forming contact holes in the insulating layer, but before forming the conductive layer. The barrier metal layer may comprise a material selected from the group of Ti, TiN, Ti/TiN, Ta, TaN, and Ta/TaN.

The rotation speed of the semiconductor substrate is preferably between 200 to 5000 rotations per minute. The etching composition is preferably supplied at the rate of 0.1 to 2.5 l/min.

The etching composition is supplied by a nozzle placed over the semiconductor substrate, the nozzle experiencing boom swing either to the right of center or to the left of center of the semiconductor substrate. The boom swing preferably varies from 80 mm to the left of the center of the semiconductor substrate and 80 mm to the right of center of the semiconductor substrate. The boom swing may comprise a long distance boom swing portion and short distance boom swing portion, which are carried out sequentially.

The processing temperature of the etching composition is in the range of 20 to 90° C., and the semiconductor substrate is preferably heated to about the processing temperature of the etching composition.

More specifically the etching composition may comprise 0.01 to 30 weight percent of $HNO_3$, as an oxidant, 0.01 to 30 weight percent of $NH_4F$ as an enhancer, and a remaining weight percent of deionized water. The etching composition may also comprise 3 to 55 weight percent of $HNO_3$, as an oxidant, 0.2 to 35 weight percent of HF, as an enhancer, and a remaining weight percent of deionized water. The etching composition may also comprise 0.2 to 30 weight percent of $H_2O_2$, as an oxidant, 0.01 to 30 weight percent of $NH_4OH$, as an enhancer, and a remaining weight percent of deionized water. The etching composition may also comprise 3 to 60 weight percent of $HNO_3$, as an oxidant, 0.06 to 30 weight percent of HF, as an enhancer, and a remaining weight percent of deionized water.

There is also provided a method of manufacturing semiconductor devices comprising the steps of forming an. insulating layer over a semiconductor substrate, forming contact holes in the insulating layer, forming a conductive layer over the insulating layer to burying the contract holes, rotating the semiconductor substrate, performing a first etching by supplying onto the rotating semiconductor substrate a first etching composition having a first etch rate, in order to etch the conductive layer by the thickness of between 40% to 95% of a total thickness of the conductive layer; and performing a second etching by supplying onto the rotating semiconductor substrate a second etching composition having a second etch rate lower than the first etch rate, in order to etch the remaining portion. of the conductive layer, wherein after the second etching, the conductive layer remains only inside the contact holes.

A method of manufacturing semiconductor devices is also provided, comprising the steps of forming a pattern structure over a semiconductor substrate, forming an interlayer dielectric layer over the semiconductor substrate and the pattern structure, rotating the semiconductor substrate, and etching the interlayer dielectric layer by supplying on the rotating semiconductor substrate an etching composition comprising a mixture of at least one oxidant selected from the group consisting of $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group consisting of HF, $NH_4OH$, $H_3PO_4$, $H_2SO_4$, $NH_4F$, and HCl, and a buffer solution, wherein the oxidant, enhancer, and buffer solution are mixed in a certain mixing ratio such that the etching planarizes the interlayer dielectric layer.

The interlayer dielectric layer may comprise a material selected from the group consisting of an oxide, a nitride, borophosphosilicate, and tetraethylorthosilicate.

An etching composition for manufacturing semiconductor devices is also provided, comprising at least one oxidant selected from the group consisting of $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group consisting of HF, $NH_4OH$, $H_3PO_4$, $H_2SO_4$, $NH_4F$, and HCl, and a buffer solution.

The etching composition may be supplied onto a rotating semiconductor substrate so as to etch a specific thin layer formed on the semiconductor substrate. The specific thin layer may comprise a material selected from the group consisting of tungsten (W), copper (Cu), polysilicon, an oxide, a nitride, borophosphosilicate, or tetraethylorthosilicate.

Also, a semiconductor substrate is provided, comprising a cell region including a conductive plug comprised of a conductive material, and a peripheral region including a hole pattern for use as one of an align mark or a scribe line, wherein the hole pattern contains none of the conductive material.

DETAILED DESCRIPTION OF THE PREFERRED EMBODIMENTS

Figure 1:
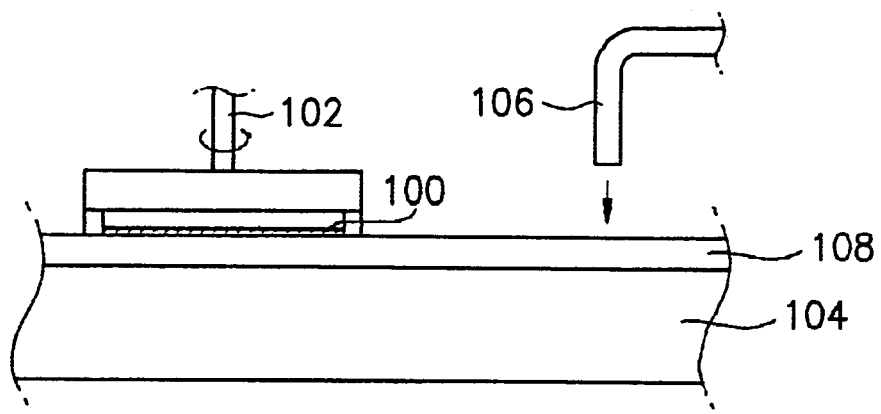
FIG. 1 is a schematic representation showing a conventional CMP apparatus for manufacturing semiconductor devices.
Figure 2:
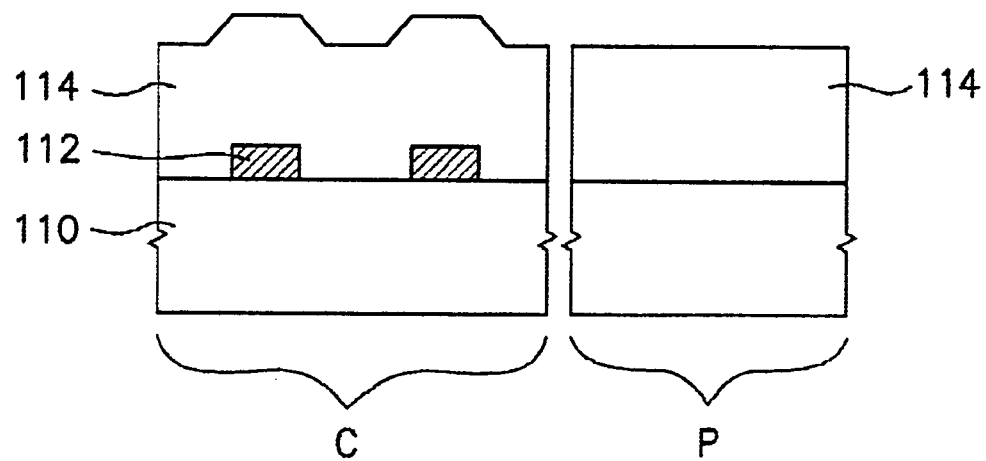
FIGS. 2 to 7 are cross sectional views showing a manufacturing process for semiconductor devices using conventional processing sequences for forming a tungsten plug and an align mark or scribe line.
Figure 3:
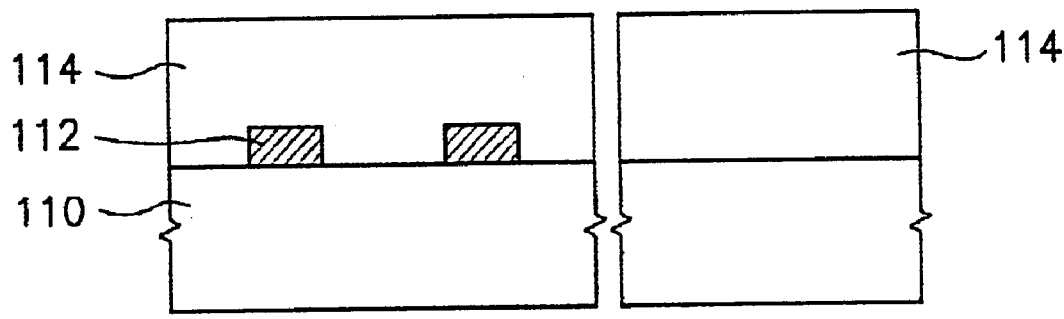
Figure 4:
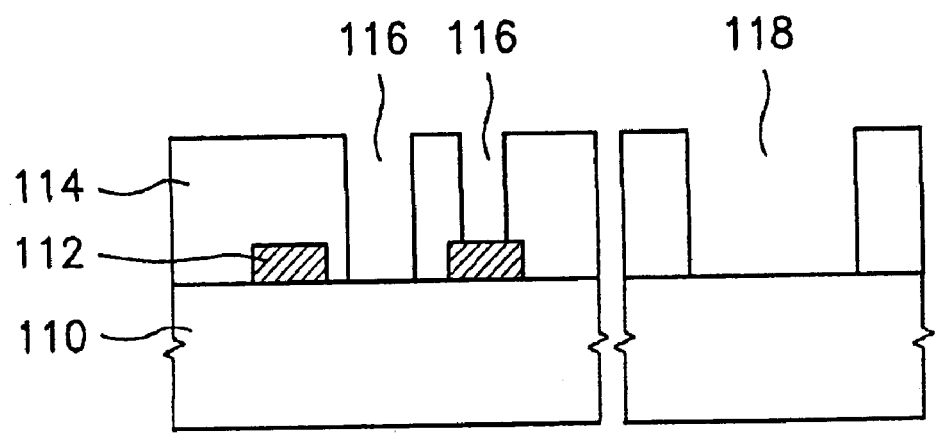
Figure 5:
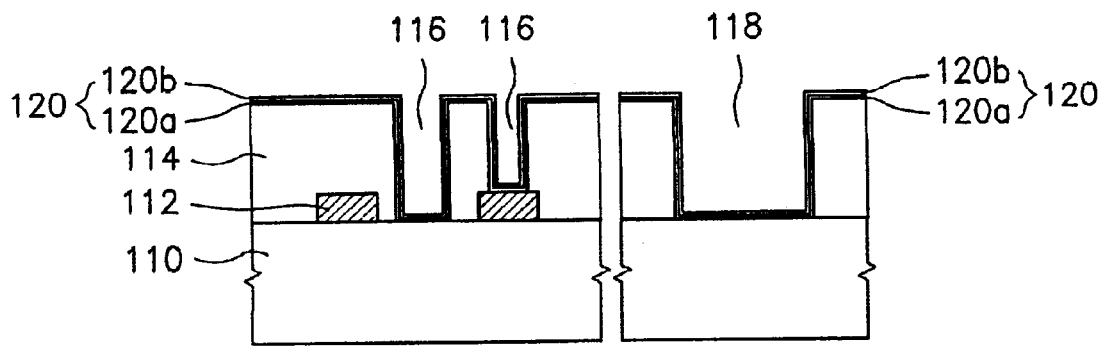
Figure 6:
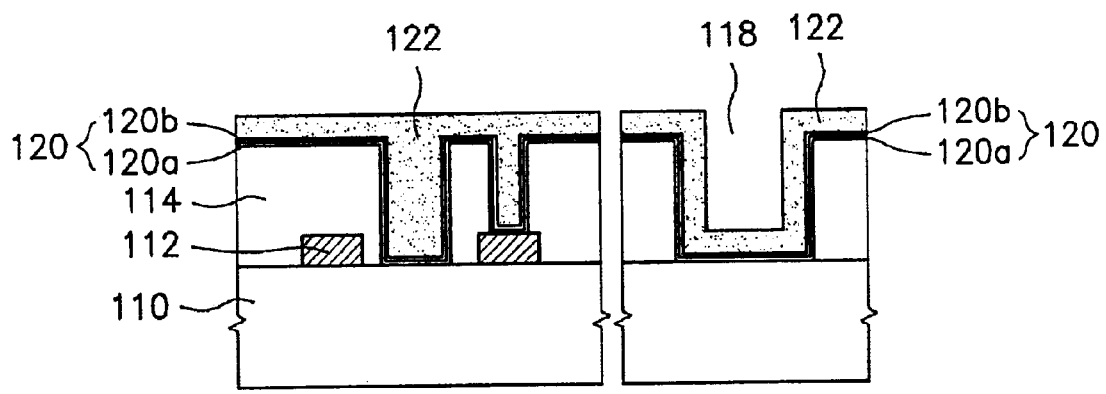
Figure 7:
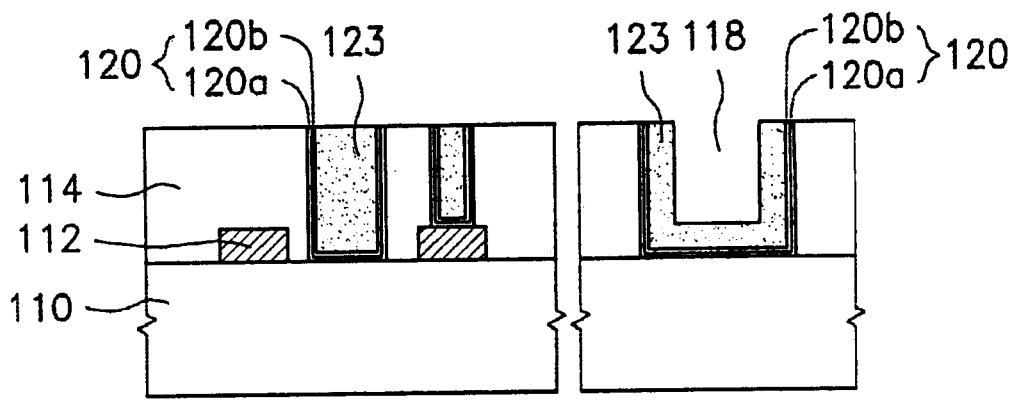

The present invention now will be described more fully below with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

According to the present invention a new spin etching method, or a Chemical Enhanced Polishing (CEP) method, is used for etching a predetermined thickness of a layer of material such as copper, tungsten, polysilicon, silicon oxide, silicon nitride, or the like. This CEP method is performed by supplying a chemical solution onto the surface of a semiconductor wafer while rotating the semiconductor wafer.

The CEP method is also used for the fabrication of semiconductor devices having a conductive line or plug (e.g., formed out of copper, tungsten, polysilicon, etc.) by applying a chemical solution onto the surface of the semiconductor wafer and rotating the semiconductor wafer.

A conductive line generally functions as an interconnect line for translating inner signals of the semiconductor device to the outside of the semiconductor device. A conductive plug generally translates electrical signal from a lower interconnect line to an upper interconnect line.

The CEP method is used for making a planarized or uniform surface of the semiconductor wafer so as to more easily facilitate the operation of subsequent processing steps for manufacturing semiconductor devices.

In the CEP method, a dielectric material formed over the surface of the semiconductor wafer, e.g., silicon oxide or silicon nitride, is planarized to minimize a step-height over the surface of the semiconductor wafer before moving to the subsequent photolithography process. The dielectric material used in this process is typically either an interlayer dielectric (ILD) or an intermetal dielectric (IMD).

According to preferred embodiments of the present invention, the etching solution or etching composition comprises an oxidant, an enhancer, and a buffer solution. The oxidant preferably includes at least one material selected from the group consisting of $H_2O_2$, $O_2$, $IO_4^-$, $BrO_3$, $ClO_3$, $S_2O_8^-$, $KIO_3$, $H_5IO_6$, KOH, and $HNO_3$. The enhancer preferably comprises at least one material selected from the group consisting of HF, $NH_4OH$, $H_3PO_4$, $H_2SO_4$, $NH_4F$, and HCl. The buffer solution is used to control the concentration, temperature, and contact angle of the etching composition, and preferably comprises deionized water.

One preferred etching composition preferably comprises 0.01 to 60 weight percent $HNO_3$ as an oxidant, 0.05 to 35 weight percent HF as an enhancer, and deionized water in the remaining percent as a buffer solution. This etching composition, including a mixture of $HNO_3$, HF, and deionized water, can be used for etching conductive layers (i.e, copper, tungsten, and polysilicon, etc.) or dielectric layers (i.e., silicon oxide, silicon nitride layer, etc.).

Another preferred etching composition comprises 0.2 to 30 weight percent $H_2O_2$ as an oxidant, 0.01 to 30 weight percent $NH_4OH$ as an enhancer, and deionized water in the remaining percent as a buffer solution. This etching composition, including a mixture of $HNO_3$, $NH_4F$, and deionized water, can be used for etching conductive or dielectric layers, as well as barrier layers (i.e., Ti, Ta, Ti/TiN, Ta/TaN, etc.).

Yet another preferred etching composition comprises 0.01 to 30 weight percent $HNO_3$ as an oxidant, 0.01 to 30 weight percent $NH_4F$ as an enhancer, and deionized water in the remaining percent as a buffer solution. This etching composition, including a mixture of $HNO_3$, $NH_4F$, and deionized water, can be used for etching conductive or dielectric layers as well as barrier layers.

Figure 8:
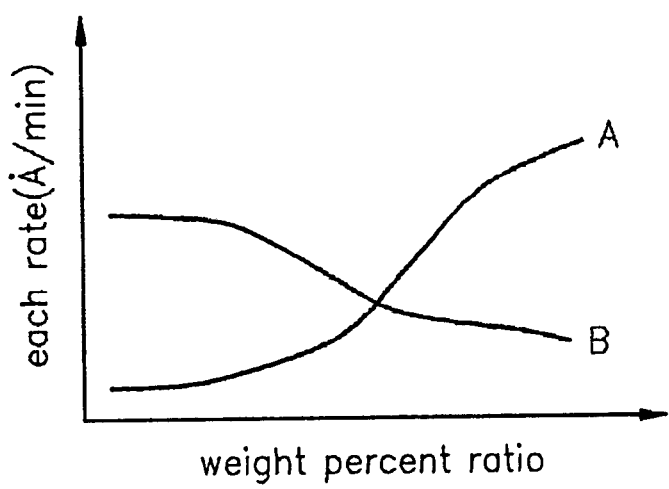
FIG. 8 is a graphical representation showing the etch rate trend of an etching composition for a tungsten layer by weight percent ratio.

FIG. 8 is a graphical representation showing the etch rate trend of the etching composition for a tungsten layer according to the weight percent ratio of the oxidant used in the etching composition.

As shown in FIG. 8, line A describes the etch rate trend of a composition comprising a mixture of $HNO_3$ as the oxidant, HF as the enhancer, and deionized water as the buffer solution. Line A shows that the increase of the etch rate in this case is proportional to the amount (weight percent) of the $HNO_3$ component in the total etching composition. Line B describes the etch rate trend of a composition comprising a mixture of $H_2O_2$ as the oxidant, $NH_4OH$ as the enhancer, and deionized water as the buffer solution. Line B shows that the decrease of the etch rate is proportional to the amount (weight percent) of the $H_2O_2$ component in the total etching composition.

Figure 9:
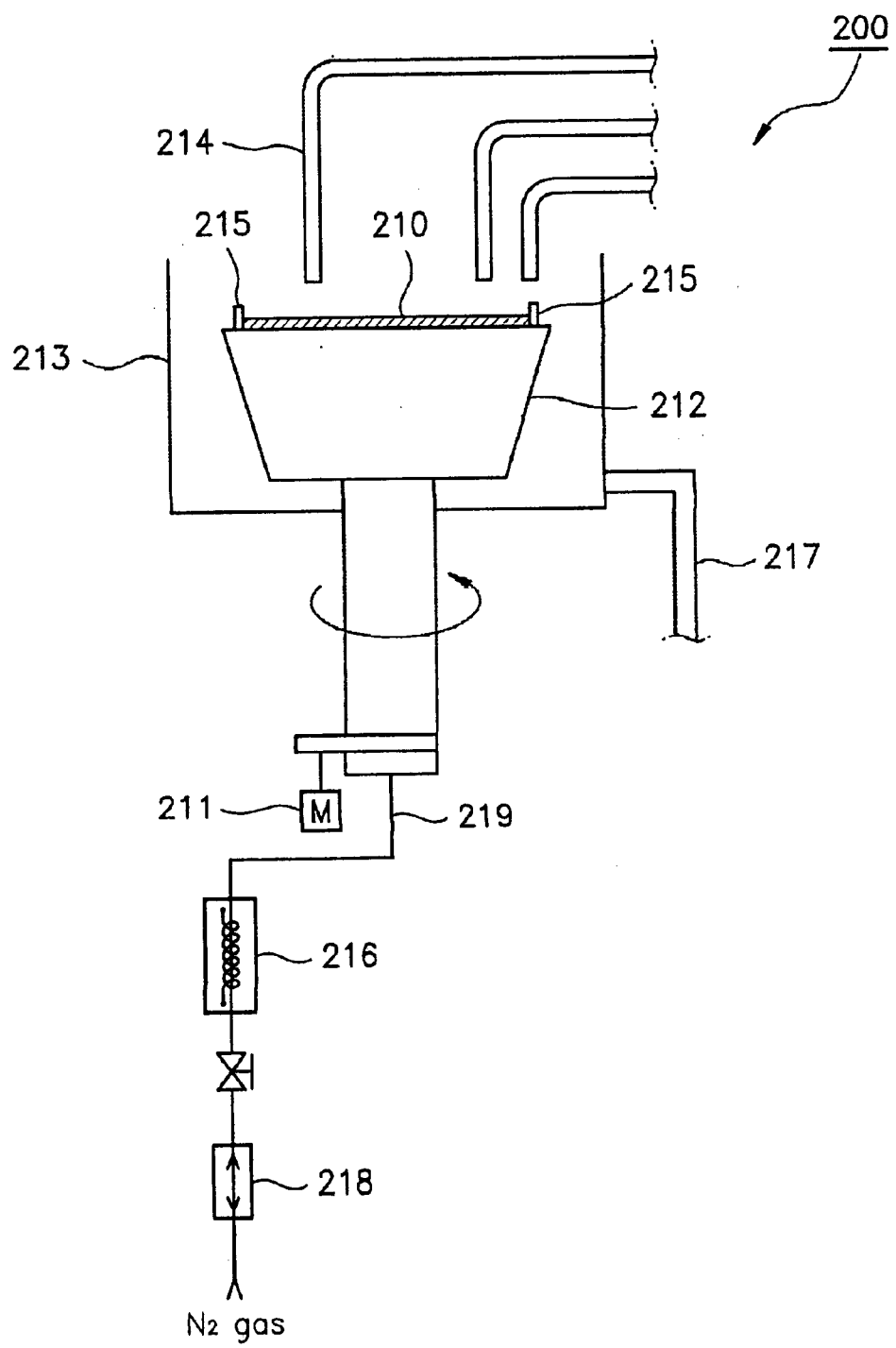
FIG. 9 is a schematic representation showing a spin etching apparatus used to carry out the fabrication process of semiconductor device according to a first preferred embodiment of the present invention.

FIG. 9 is a schematic representation showing a spin-etching apparatus used to carry out the fabrication process of semiconductor device according to preferred embodiments of the present invention.

As shown in FIG. 9, a spin etching apparatus 200 comprises a motor 211, a spin chuck 212, a bowl 213, a plurality of nozzles 214, a clamp 215, a heater 216, a drain pipe 217, a regulator 218 and an $N_2$ gas line 219. The spin chuck 212 is located under the semiconductor substrate 210, while the nozzle 214 for providing an etching composition is placed over the semiconductor substrate 210. The nozzles 214 can preferably move to the left or right of the spin chuck 212, and supply the etching composition onto the semiconductor substrate 210. One of the nozzles 214 can preferably also be used for a cleaning solution such as deionized water.

The bowl 213 is provided for covering the spin chuck 212 and for preventing the etching composition from flowing out during the process. The $N_2$ gas supplied through the $N_2$ gas line, 219 is supplied to the spin chuck 212 to lift up the semiconductor substrate 210 by about 2 mm. $N_2$ gas is useful for treating especially the back side of the semiconductor substrate 212.

The preferred spin etching apparatus disclosed in FIG. 9 uses the heater 216 to control the temperature of the $N_2$ gas. In addition, this apparatus may also have another heater (not shown) to control the temperature of the etching composition.

Although $N_2$ gas is used in the first preferred embodiment for heating the semiconductor substrate 210, other gasses may also be used. It is preferable, however, that the gas used be an inert gas, so that the gas itself does not interfere with the etching process.

The temperature of the etching composition is preferably in a range from 20 to 90° C. More preferably, the temperature of the etching composition is in a range from 30 to 70° C. to accelerate the etch rate of the material layer on the semiconductor substrate. The preferred temperature of the $N_2$ gas is also in a range from 30 to 70° C. to heat the semiconductor substrate 210 on the spin chuck 212. If the semiconductor substrate 210 is not heated while the etching composition is heated, the temperature difference between the semiconductor substrate 210 and the etching composition will cause a different etch rate throughout the material layer (e.g., copper, tungsten, polysilicon, silicon oxide, silicon nitride, etc.). This, in turn, can result in a nonuniform surface of the semiconductor substrate 210 after the etching process.

In an operation the temperature of the etching composition changes, i.e., cools, as it is supplied from the nozzle 214 onto the semiconductor substrate 210 and is spread over the surface of the semiconductor substrate 210. Since the temperature of the etching composition changes as it flows, it therefore varies at each point of the surface of the semiconductor substrate 210. In other words, the temperature of the etching composition, which is applied onto the semiconductor substrate 210, varies across all of the contact points on the surface of the semiconductor substrate 210.

As a result of this temperature difference, a portion on the semiconductor substrate 210 with which the etching composition is first applied/contacted has a higher etch rate than a portion of the semiconductor substrate 210 with which the etching composition is later supplied/contacted.

The etch rate also varies according to the flow of the etching composition throughout the surface of the semiconductor substrate, which results in the nonuniform surface of the semiconductor substrate 210. These etching variations are more serious for larger-diameter semiconductor wafers such as a 300 mm-diameter wafer. This is true because the larger a wafer is, the more temperature differences of the etching composition occur across the surface of the semiconductor wafer.

Therefore, the concept of the present invention teaches various methods of providing uniform process conditions such as the supply of a heated $N_2$ gas to the substrate, the presence of a heater below the spin chuck 212, a method to house or close a spin etching process chamber in a closed, temperature-controlled, process environment, and the like.

The supply speed of the etching composition is preferably about 0.1 to 2.5 l/min., and the etching composition can be supplied onto the semiconductor substrate 210 to either the right or the left from the center by a boom swing of varying degree.

The boom swing refers to the movement ranges of the nozzle 214 over the semiconductor substrate 210 supplies the etching composition. For reference purposes, a boom swing to the left side from the center of the semiconductor substrate 210 is referred to a negative (−), and a boom swing to the right side from the center of the semiconductor substrate 210 is referred to as positive (+). For the preferred embodiments described in this disclosure, the boom swing is given in units of mm.

The boom swing movement range of the present invention is preferably from 0 to +/−80. In other words, the nozzle 214 preferably supplies the etching composition while moving up to 80 mm to the left or right side of the center of the semiconductor substrate 210. The boom swing for a given CEP process should be optimized because the boom swing is a parameter that effect the etching uniformity of the thin layers to be etched.

The boom swing should be preferably carried out with both a long distance boom swing and a short distance boom swing, which are sequentially carried out. A long distance boom swing is a boom swing where the nozzle 214 is moved across a long distance, e.g. up to the maximum possible swing allowable by the nozzle 214. A short distance boom swing is a boom swing where the nozzle 214 is moved across a shorter distance than for a long boom swing, e.g. some distance less than the maximum possible swing allowable by the nozzle 214.

Figure 10:
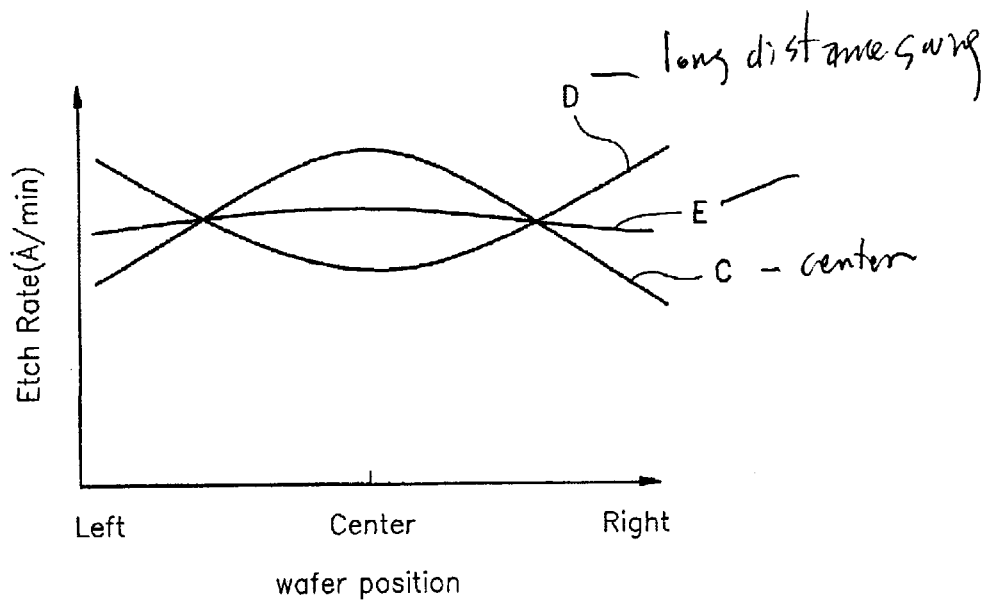
FIG. 10 is a graphical representation showing the etch rate according to the boom swing according to a first preferred embodiment of the present invention.

FIG. 10 is a graphical representation showing the etch rate according to the boom swing across various positions in the substrate 210. The graph shows the etch rate when etching a tungsten layer using an etching composition comprising a mixture of $HNO_3$ as an oxidant, HF as an enhancer, and deionized water as a buffer solution.

Line C shows the etch rate when supplying the etching composition on the semiconductor substrate with the nozzle 214 fixed on the center of the semiconductor substrate. As shown in line C, in this situation, the etch rate at the center portion of the semiconductor substrate 210 is relatively higher than the etch rate at the peripheral edge of the semiconductor substrate 210.

Line D shows the etch rate when supplying the etching composition on the semiconductor substrate with the nozzle 214 carrying out a long distance boom swing. As shown in line D, in this situation, the etch rate at the peripheral edge of the semiconductor substrate 210 is relatively higher than the etch rate at the center portion of the semiconductor substrate 210.

Line E shows the etch rate when supplying the etching composition on the semiconductor substrate with the nozzle 214 sequentially carrying out a long distance boom swing and a short distance boom swing. As shown in line E, in this situation, the etch rates at both the peripheral edge and the center of the semiconductor substrate 210 are almost similar.

Figure 11:
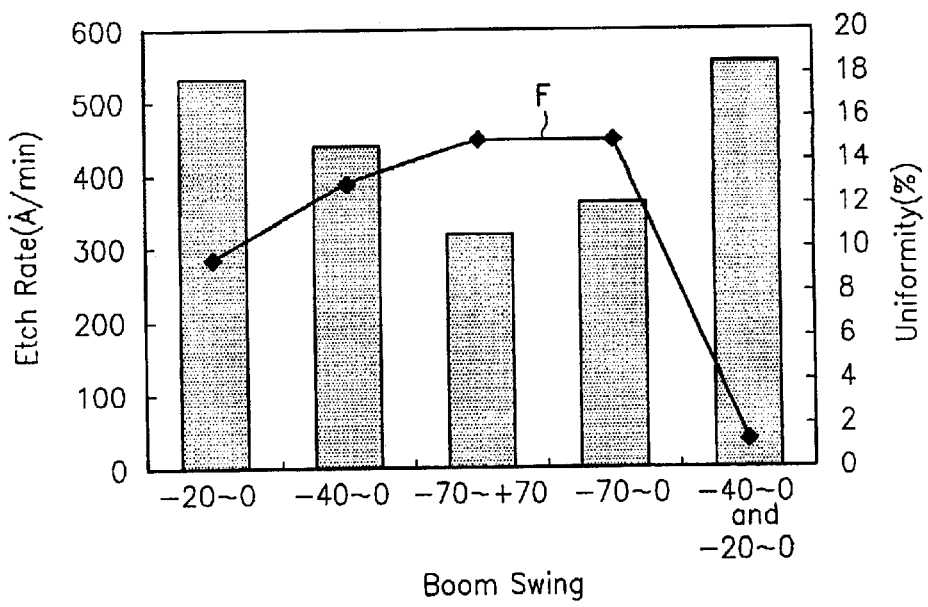
FIG. 11 is a graphical representation showing the rate and the etch uniformity for to various boom swings according to a first preferred embodiment of the present invention.

FIG. 11 is a graphical representation showing the etch rate and the etch uniformity according to various boom swings. The graph shows the etch rate when etching a tungsten layer using an etching composition comprising a mixture of $HNO_3$ as an oxidant, $NH_4F$ as an enhancer, and deionized water as a buffer solution. In particular, the bar graphs show the etch rate, and line F shows the etch uniformity.

The etch rate, shown in the bar graph of FIG. 11, represents the thickness of a thin layer to be etched by an etching solution for a certain time. The etching uniformity, shown in line F of FIG. 11, represents a deviation of the thickness at a plurality of points of the thin layer, e.g., a center point, an edge point, and a middle point, after the etch is completed. Therefore, the lower the value of the deviation between the points shown, the more uniform is the resulting etching.

As shown in FIG. 11, when sequentially and continuously carrying out the long distance boom swing and the short distance boom swing, the etch rate is increased and the etch uniformity is improved. When the boom swing is −20~0, the etch rate is about 540 Å/min, which is sufficient for the process condition. However, the uniformity is about 10%, which is too high. When the boom swing is −40~0, the etch rate lowers to an unsuitable level, and the uniformity rises to and even more unacceptable amount.

However, when the boom swing is carried out sequentially at −40~0 and −20~0, the etch rate is about 540 Å/min and the etch uniformity is about 1%, both of which are acceptable for the process condition. This means that the line E in FIG. 10 can be obtained by combining the process conditions for lines D and C.

Furthermore, according to preferred embodiments of the present invention, when there is a portion of a thin layer over the semiconductor substrate that requires greater etching, the nozzle 214 supplying the etching composition is allowed to stay longer, and the etching composition is allowed to be supplied for a longer period of time over the portion to be etched.

The rotation speed of the spin chuck while supplying the etching composition is preferably in the range of 200 to 5000 rotations per minute (rpm).

A method of manufacturing semiconductor devices using the etching composition will be described below according to preferred embodiments, but the present invention should not be constructed to be limited to these following embodiments.

A First Preferred Embodiment

A first preferred embodiment of the method of manufacturing semiconductor devices to form a conductive plug will now be described. This embodiment provides a new method to form an interconnect conductive plug without the surface microscratches caused by a CMP process and without the increasing contact resistance caused by a Dry Etch-Back process.

According to the present invention, a method of manufacturing semiconductor devices includes the steps of forming a dielectric layer over a semiconductor substrate, forming contact holes in the dielectric layer, forming a conductive layer over the dielectric layer and filling the contact holes, rotating the semiconductor substrate, and supplying etching composition onto the rotating semiconductor substrate. The etching composition preferably comprises a mixture of at least one oxidant selected from the group consisting of $H_2O_2$, $O_2$, $IO_4^-$, $BrO_3$, $ClO_3$, $S_2O_8^-$, $IO_3$, $H_5IO_6$, KOH, and $HNO_3$, at least one enhancer selected from the group consisting of HF, $NH_4OH$, $H_3PO_4$, $H_2SO_4$, $NH_4F$, and HCl, and deionized water in a certain mixing ratio such that after etching, the material of the conductive layer only remains inside the contact hole and does not remain over the dielectric layer.

The conductive layer is preferably a tungsten layer (W) or a copper layer (Cu). The conductive plug preferably connects an upper conductive layer and a lower conductive layer through contact holes formed in the dielectric layer.

During the formation of the conductive plugs, a semiconductive substrate 210 having a conductive layer formed over it is preferably mounted on a rotatable spin chuck 212, and is rotated at a certain rate.

By supplying an etching composition through a nozzle 214 placed over the semiconductor substrate 210, the conductive layer on the semiconductor substrate 210 is then etched such that the conductive layer only remains inside the contact holes and does not remain over on the dielectric layer.

In other words, the conductive layer is etched by the increased etch momentum in the horizontal direction by the centrifugal force of the semiconductor substrate 210 by the rotation of the spin chuck 214 and the etching composition, which has a good reaction with the conductive layer.

The higher the rotation speed of the spin chuck 214, the more the etch momentum will increase in the horizontal direction. As a result, by this process the etch speed of the conductive layer and the etch uniformity are improved, and the generation of unnecessary voids formed on the surface of the conductive layer is prevented.

The supply of the etching composition onto the semiconductor substrate is preferably carried out in two steps. The first step includes supplying a first material including a first etching composition having a first etch rate. The second step includes supplying a second material including a second etching composition having a second etch rate lower than the first etch rate.

FIGS. 12 to 17 are sectional views that show the processing sequences of a tungsten plug formation process using the method of manufacturing semiconductor devices according to the first preferred embodiment of the present invention. These drawings show the formation of the conductive plug (e.g., a tungsten plug) and the formation of either an align mark or a scribe line. In these drawings, a cell portion (C) for the formation of the circuit patterns and a peripheral portion (P) for the formation of the align mark or scribe line are shown.

Figure 12:
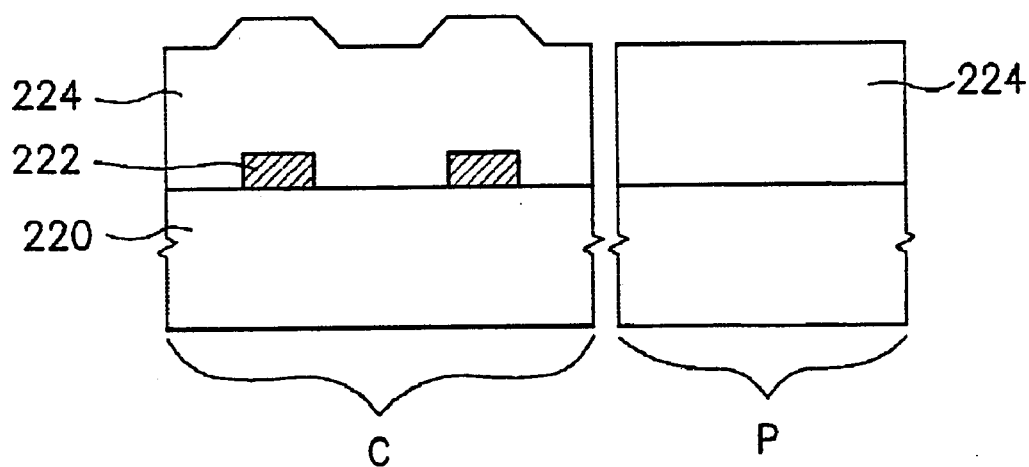
FIGS. 12 to 17 are cross sectional views showing the processing sequences used to describe a tungsten plug formation process according to a first preferred embodiment of the present invention.

Referring to FIG. 12, an oxide film 224 is formed over the semiconductor substrate 220, which has a plurality of local patterns 222 formed on it a certain distance apart from each other. The local patterns 222 are preferably either polysilicon patterns or metal patterns used as a lower conductive layer. The oxide layer 224 can be a silicon dioxide layer ($SiO_2$), phosphosilicate (PSG), or borophosphosilicate (BPSG), or the like, which are preferably formed by a typical CVD method or spin on glass (SOG) method. The thickness of the oxide layer 224 is preferably about 4000 to 15000 Å.

Figure 13:
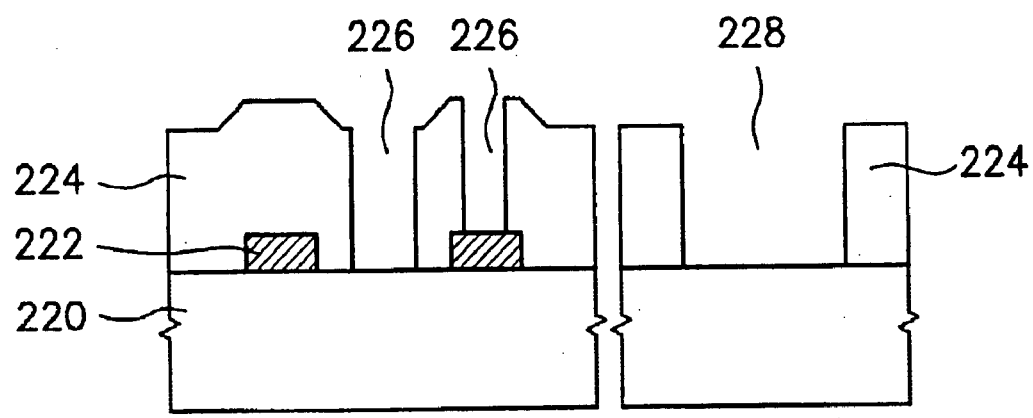

Referring to FIG. 13, a photoresist (not shown) is coated over the oxide layer 224 and patterned (not shown) by a conventional photolithography process. A portion of the oxide layer 224 is then etched by a conventional etching process to form a contact hole 226, as well as a peripheral hole 228 to be used as an align mark or scribe line. The peripheral hole 228 preferably has a bigger diameter than that of the contact hole 226.

Figure 14:
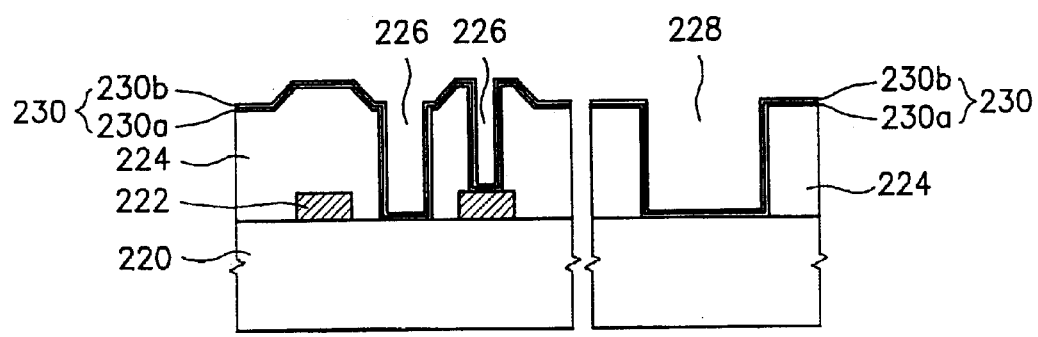

Referring to FIG. 14, a barrier layer 230 (e.g., a dual Ti/TiN layer) is preferably formed in the contact hole 226 and in the peripheral hole 228 before a conductive material is deposited. The barrier layer 230 preferably comprises a lower barrier layer 230a (e.g., Ti) and an upper barrier layer 230b (e.g., TiN). When the barrier layer 230 is formed in the contact hole 226 and in the peripheral hole 228, the thickness of the barrier layer 230 is preferably about 700 Å. The formation of the lower barrier layer 230a and the upper barrier layer 230b preferably uses a typical sputtering or CVD method.

The barrier layer 230 is preferably used to decrease the contact resistance of the electrode and to improve the adhesiveness between a conductive material and the oxide layer 224. The barrier layer 230 can also be used as stopper layer during the removal of the conductive material in subsequent processes.

Figure 15:
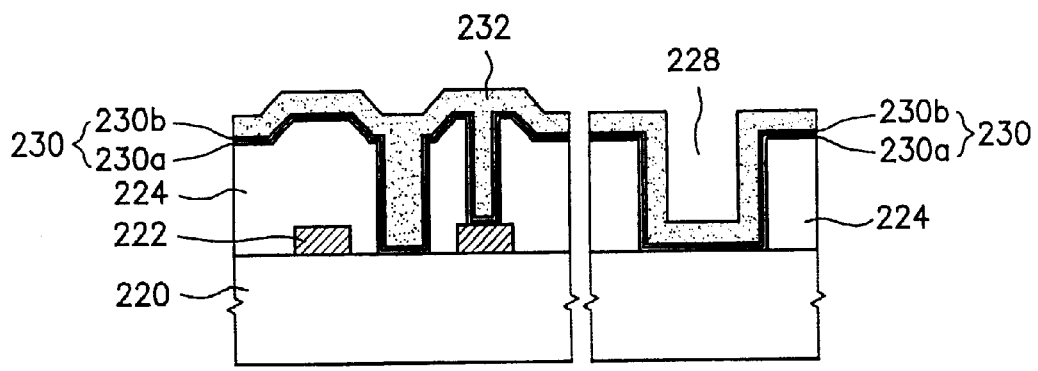

Referring to FIG. 15, a first conductive layer 232 (e.g., a first tungsten layer) is formed over the surface of the semiconductor substrate 220, and in both the contact hole 226 and the peripheral hole 228. Because the peripheral hole 228 in the peripheral portion (P) has a bigger diameter than that of the contact hole 226 in the cell portion (C), the peripheral hole 228 is not fully filled with the first conductive layer 232, but only has its bottom and side walls covered.

Figure 16:
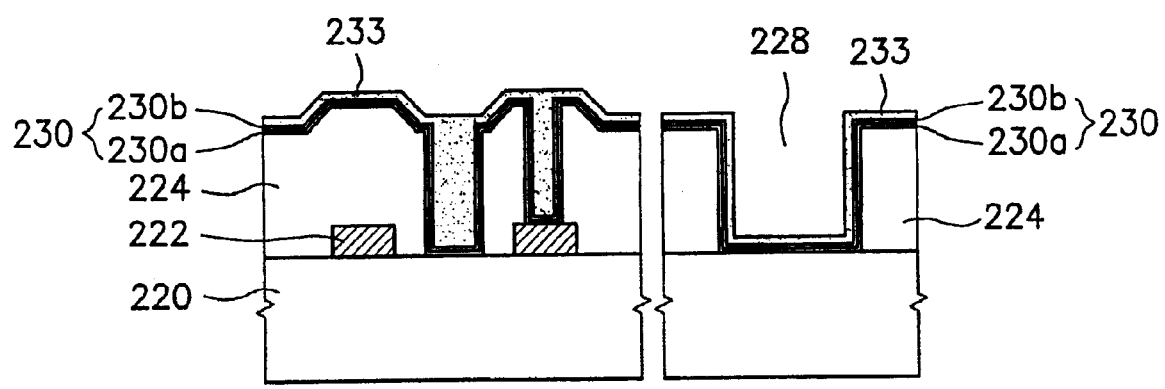

Referring to FIG. 16, the semiconductor substrate 220, including the first conductive layer 232, is placed on the spin chuck 212 shown in the FIG. 9. The first conductive layer 232 is then etched to form a second conductive layer 233 (e.g., a second tungsten layer) by rotating the semiconductor substrate 220 on the spin chuck 212, and spraying the etching composition through a nozzle 214 over the semiconductor substrate 220, and the first conductive layer 232. Preferably, the supply amount of the etching composition is about 0.1 to 2.5 l/min., and the etching composition preferably comprises about 3 to 55 weight percent $HNO_3$ as an oxidant, 0.2 to 35 weight percent HF as an enhancer, and the remaining percent of deionized water as a buffer solution. Most preferably, the etching composition comprises 10 to 45 weight percent $HNO_3$ as an oxidant, 1 to 24 weight percent HF as an enhancer, and the remaining percent of deionized water as a buffer solution. The processing temperature preferably ranges from about 20 to 90° C., and most preferably from about 30 to 70° C. The rotation speed of the spin chuck 212 is preferably in the range of from about 200 to 5000 rpm, preferably from about 1000 to 3000 rpm.

Heated gas, preferably $N_2$ gas, is supplied to the back side of the semiconductor substrate 220, preferably at a temperature of about 30 to 150° C. in order to reduce the temperature difference between the etching composition and the semiconductor substrate 220, and to thereby improve the uniformity of the etching process. The etch rate of the first conductive layer 232 is preferably in the range of from 70 to 22000 Å/min. The processing time varies depending upon the thickness of the first conductive layer 232, and can be adjusted according to the processing conditions. The etched thickness of the first conductive layer 232 (i.e., the thickness of the portion of the first conductive layer 232 that is etched away) is preferably about 40 to 95% of the thickness of the first conductive layer 232, most preferably in the range of about 70 to 90%.

Figure 17:
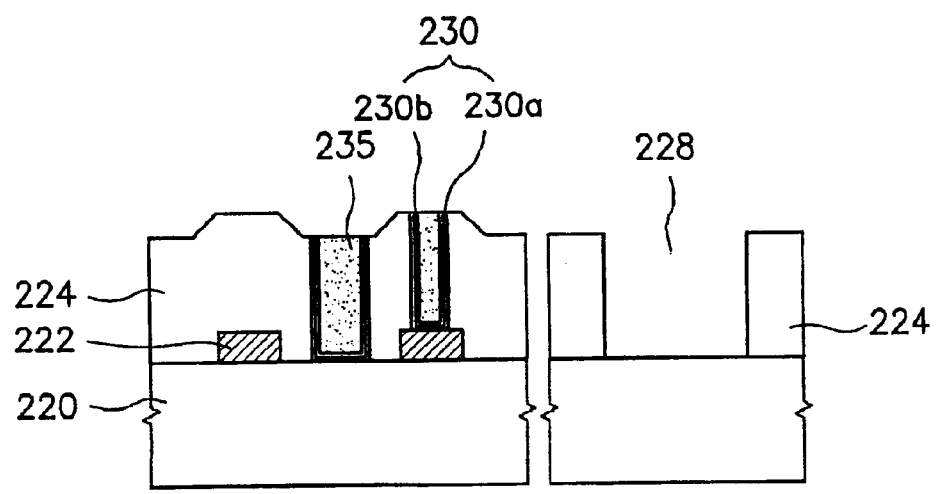

Referring to FIG. 17, the conductive tungsten layer 233 then is etched so as to form a conductive plug 235 by rotating the semiconductor substrate 220 over the spin chuck 212 and spraying the etching composition through a nozzle 214 over the semiconductor substrate 220 and the second conductive layer 233. Preferably the supply amount for this process is about 0.1 to 2.5 l/min., and the etching composition preferably comprises 0.2 to weight percent $H_2O_2$ as an oxidant, 0.01 to 30 weight percent $NH_4OH$ as an enhancer, and the remaining percent of deionized water as a buffer solution. Most preferably, the etching composition comprises 1.0 to 30 weight percent $H_2O_2$ as an oxidant, 0.01 to 29 weight percent $NH_4OH$ as an enhancer, and the remaining percent of deionized water as a buffer solution.

An alternate preferred etching composition comprises 0.01 to 30 weight percent $HNO_3$ as an oxidant, 0.01 to 3.0 weight percent $NH_4F$ as an enhancer, and the remaining percent of deionized water as a buffer solution.

The processing temperature is preferably in the range of about 20 to 90° C., most preferably about 30 to 70° C., and the rotation speed of the spin chuck 212 is preferably in the range of from about 200 to 5000 rpm. Heated gas, e.g., $N_2$ gas, preferably at a temperature of about 30 to 150° C., is supplied to the back side of the semiconductor substrate 220 in order to reduce the temperature difference between the etching composition and the semiconductor substrate 220, thereby improving the uniformity of the etching process. The etch rate of the second conductive layer 233 is preferably in the range of about 30 to 12000 Å/min. The processing time varies according to the thickness of the second conductive layer 233, and can be adjusted according to the processing conditions.

In this CEP etching process, the second conductive layer 233 in the peripheral hole and the portion of the barrier layer 230 in the peripheral hole 228 is removed by the CEP process. Also, the portion of the barrier layer 230 over the top surface of the oxide layer 224 in the cell portion is also removed by the CEP process. Because the peripheral hole 228 is bigger than the contact hole 226 containing the conductive plug 235, the etching composition goes into the peripheral hole 228 sufficiently to remove the second conductive layer 233 and the barrier layer 230 from the peripheral hole 228.

In the alternative, the removal of the second conductive layer 233 and the barrier layer 230 can be performed in two sequential stages, i.e. first removing the second conductive layer 233, and then removing the barrier layer 230.

As above, the conductive plug formation process is preferably divided into two steps. A first, high-etching-rate step, using a first etching composition preferably having a high etch rate, e.g., comprising HF and $HNO_3$, is used to etch 40 to 95% of the thickness of the first conductive layer 232. Then, a second, lower-etch-rate step, using an etching composition preferably having a lower etch rate, e.g., comprising $H_2O_2$ and $NH_4OH$ or $HNO_3$ and $NH_4F$, is used so as to etch the remaining portion of the second conductive layer 233 on the barrier layer 230. As a result of this process, the conductive plug 235 is formed so that the conductive material deposited as a first conductive layer only remains inside the contact holes 226.

In addition, in order to form the conductive plug 235, the removal of the first conductive layer 232 can be carried out through the use of multiple steps.

The semiconductor device fabricated according to the present invention comprises a cell region including a conductive plug, and a peripheral region including a peripheral hole pattern to be used for an align mark or a scribe line. The peripheral hole pattern is preferably formed by the same process as the contact hole pattern formation process for the conductive plug, and none of the conductive materials remains inside the peripheral hole pattern in the peripheral region.

In addition, according to the present invention, the formation of semiconductor devices having multiple structures e.g. stacked structures, is possible.

Figure 18:
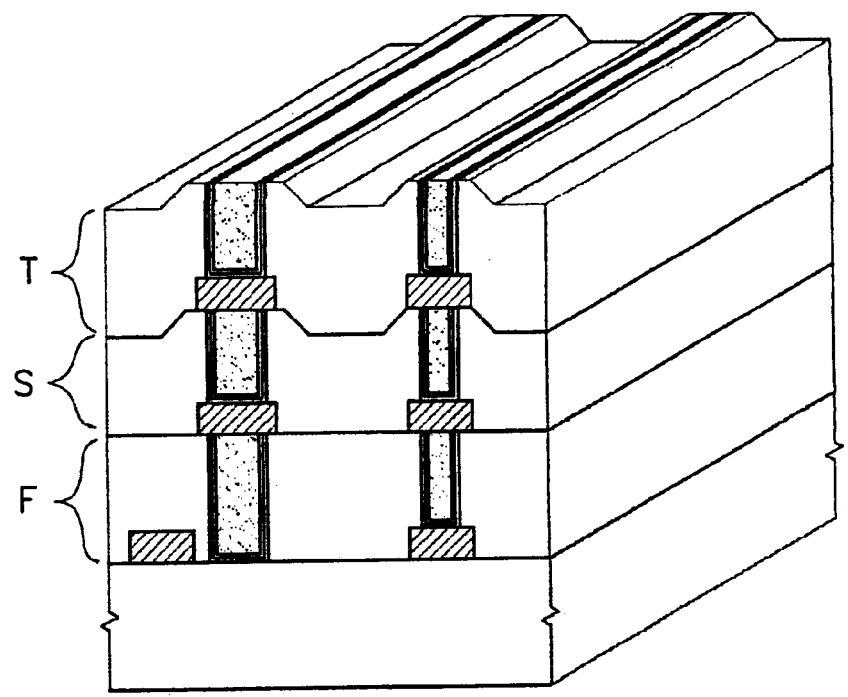
FIG. 18 is a drawing showing a multiple-layer structure created using a method of manufacturing semiconductor devices according to a first preferred embodiment of the present invention.

FIG. 18 is a drawing showing a multiple structure created by a method of manufacturing semiconductor devices according to the first preferred embodiment of the present invention. As shown in FIG. 18, a desirable multiple structure (including three layers of structure F, S, and T) can be created by repeatedly preforming the plug formation process, a situation that is impossible using a conventional CMP process. In this multiple structure, a second layer structure (S) is formed over a first layer structure (F), and a third layer structure (T) is formed over the second layer structure (S). This multiple structure can be created effectively without the performance of a planarization process on the lower layers. Furthermore, the multiple layer structure is not limited to the three layer structure as shown in FIG. 18, but can be made with various numbers of layers.

In summary, the above method can be employed the formation of the conductive plugs, and the formation of the conductive line over a semiconductor substrate having a multiple-layer structure as well. As a result of this method, the semiconductor device fabrication process is simplified thereby improving the productivity of the manufacturing process.

A Second Preferred Embodiment

As semiconductor devices, become more highly integrated, the depth of contact holes becomes deeper and the diameter contact holes becomes smaller. As a result, it has become more difficult to bury the contact holes with thin layers. Therefore, a pad should be formed over the portion where contact holes are formed to lessen the depth of the contact holes and thus improve the profile of the contact holes.

FIGS. 19 to 23 are cross sectional views that show the cell-pad formation process with a polysilicon plug using a method of manufacturing semiconductor devices according to a second preferred embodiment of the present invention.

Figure 19:
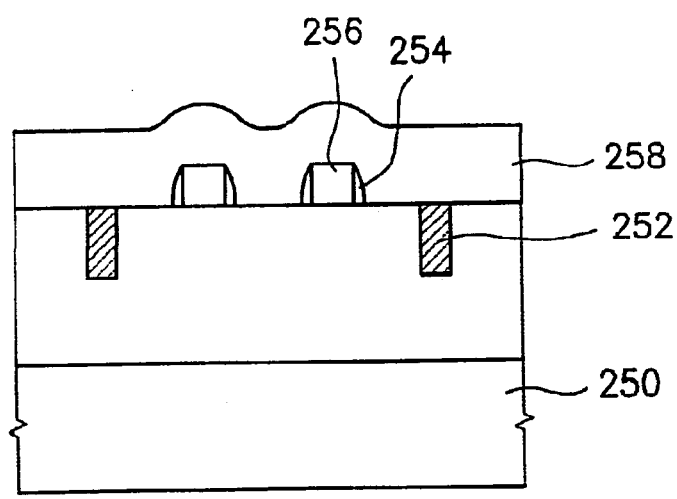
FIGS. 19 to 23 are cross sectional views showing the cell-pad formation process with the polysilicon plug using a method of manufacturing semiconductor devices according to a second preferred embodiment of the present invention.

Referring to FIG. 19, a first dielectric layer 258 is formed over a plurality of gate electrodes 256 formed on the semiconductor substrate 250. The gate electrodes 256 are spaced apart from each other and are surrounded by spacers 254. A cell on the semiconductor substrate 250 is divided into an active region and an inactive region by trench-isolation regions 252 to isolate various elements on the substrate 250. The first dielectric layer 258 insulates between the cell-pads when forming the cell-pad between the gate-electrodes 256. The first dielectric layer 258 is preferably a borophosphosilicate (BPSG) layer.

Figure 20:
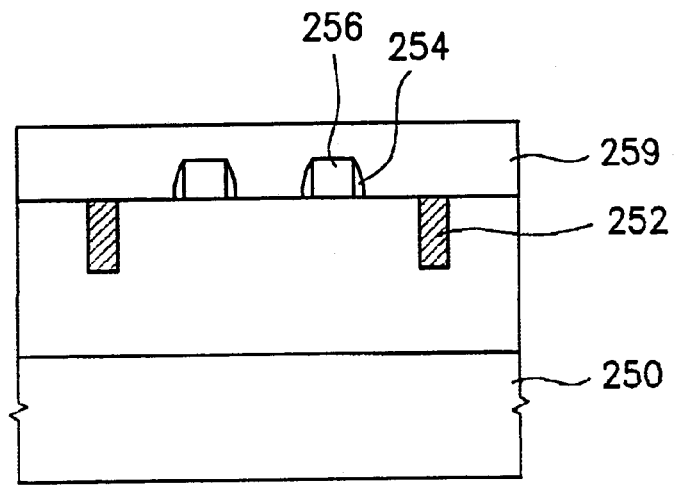

Referring to FIG. 20, the first dielectric layer 258 is preferably planarized by a CMP process to form a second dielectric layer 259.

Figure 21:
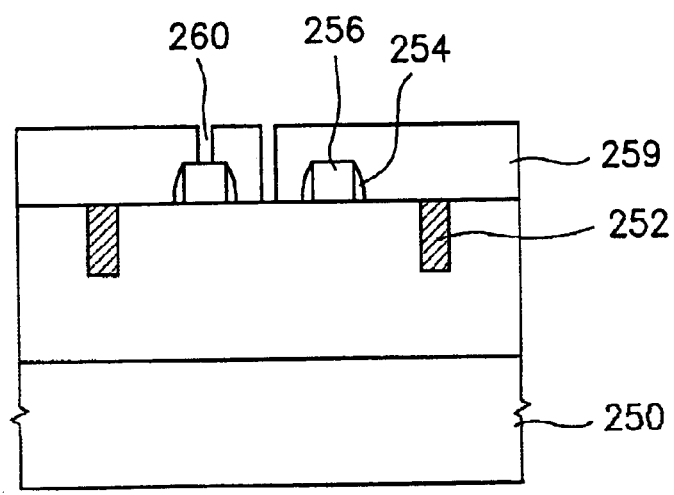

Referring to FIG. 21, contact holes 260 are then formed in the planarized second dielectric layer 259. In this process, a photoresist (not shown) is coated over the planarized second dielectric layer 259; a photoresist pattern is formed by using a typical photolithography process; and the contact holes 260 are formed by an etching process using the photoresist pattern as an etch mask. The photoresist mask is then removed.

Figure 22:
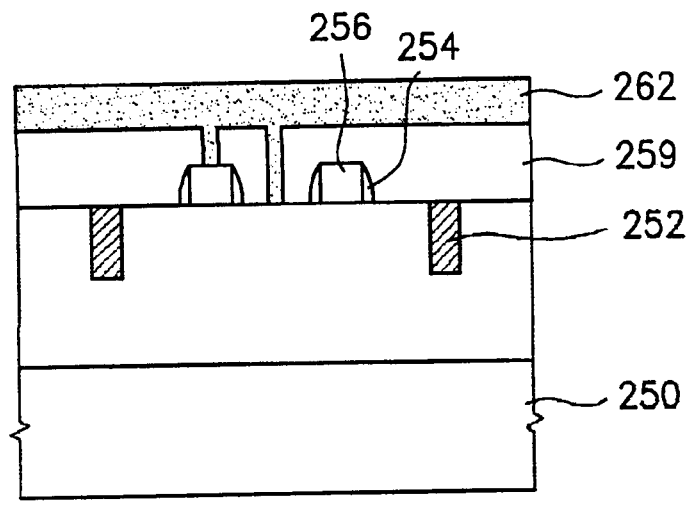

Referring to FIG. 22, a conductive layer 262 (e.g., a polysilicon layer) is formed over the second dielectric layer 259 at a certain thickness to bury the contact holes 260.

Figure 23:
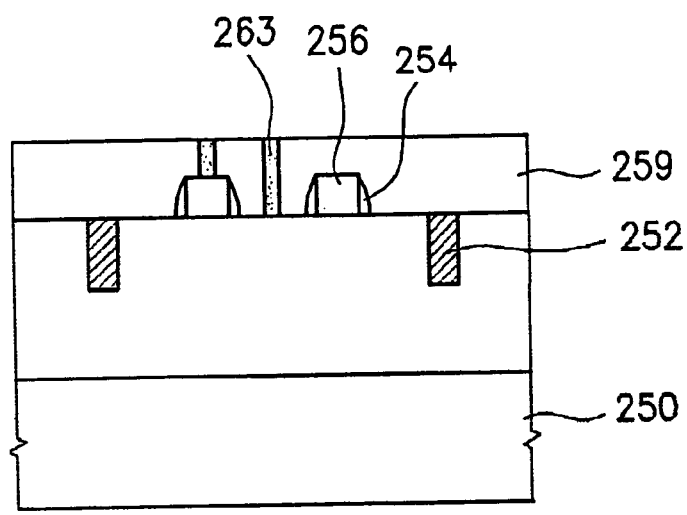

Referring to FIG. 23, the semiconductor substrate 250 including the conductive layer 262 formed on it is placed on the spin chuck 212 shown in FIG. 9. The conductive layer 262 is then etched by rotating the spin chuck 212 and spraying the etching composition through a nozzle 214 over the semiconductor substrate 250 to remove the portion of the conductive layer 262 over the second dielectric layer 259, leaving only conductive plugs 263 (e.g., polysilicon plugs) formed in the contact holes 260.

In this process, a supply amount of the etching composition is preferably from 0.1 to 2.5 l/min. The etching composition preferably comprises 3 to 60 weight percent $HNO_3$ as an oxidant, 0.06 to 30 weight percent HF as an enhancer, and the remaining percent of deionized water as a buffer solution. More preferably, the etching composition comprises 8 to 45 weight percent $HNO_3$ as an oxidant, 0.3 to 12 weight percent HF as an enhancer, and the remaining percent of deionized water as a buffer solution. The temperature of the etching composition is preferably in the range of 20 to 90° C. The rotation speed of the spin chuck 212 is preferably in the range of from 200 to 5000 rpm.

The resulting etch rate of the conductive layer 262 is preferably in the range of from 30 to 48000 Å/min. The processing time varies depending upon the thickness of the conductive layer 262, and can be adjusted according to the processing conditions.

The conductive plug 263 formed by this process may be used as a cell-pad in subsequent processes.

A Third Preferred Embodiment

As semiconductor devices become more highly integrated and include multiple layers, the step-height between the cell portion for the formation of element pattern and the peripheral portion between the cell portions increases. As a result of this increased step height, it can be difficult to obtain a precise pattern formation because of the difficulties in accurately focusing between the upper position and the lower position for exposure in the photolithography. Therefore, planarization methods are becoming increasingly important to minimize this step-height.

Figure 24:
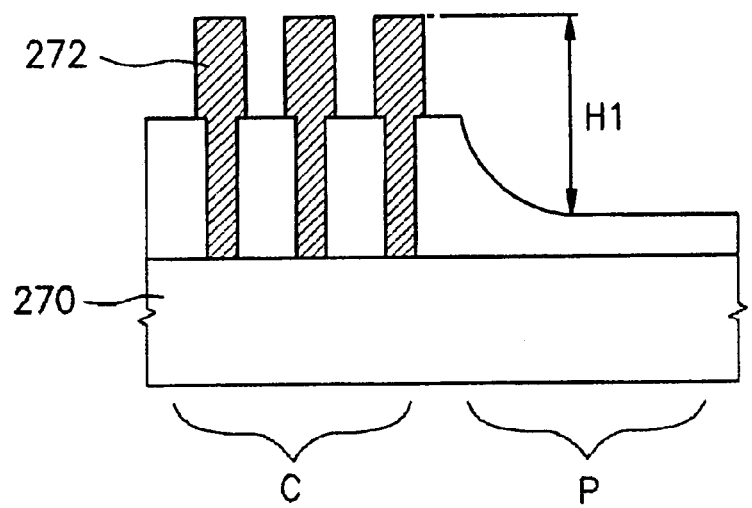
FIGS. 24 to 28 are cross sectional views showing a planarization process using a method of manufacturing semiconductor devices according to a third preferred embodiment of the present invention.

FIGS. 24 to 28 are cross sectional views that show a planarization process using a method of manufacturing semiconductor devices according to a third preferred embodiment of the present invention. FIG. 24 shows a first step-height ($H_1$) of a semiconductor device having a capacitor electrode 272 formed over a semiconductor substrate 270. The step-height ($H_1$) exists between the cell portion (C) for the element pattern and a peripheral portion (P).

Figure 25:
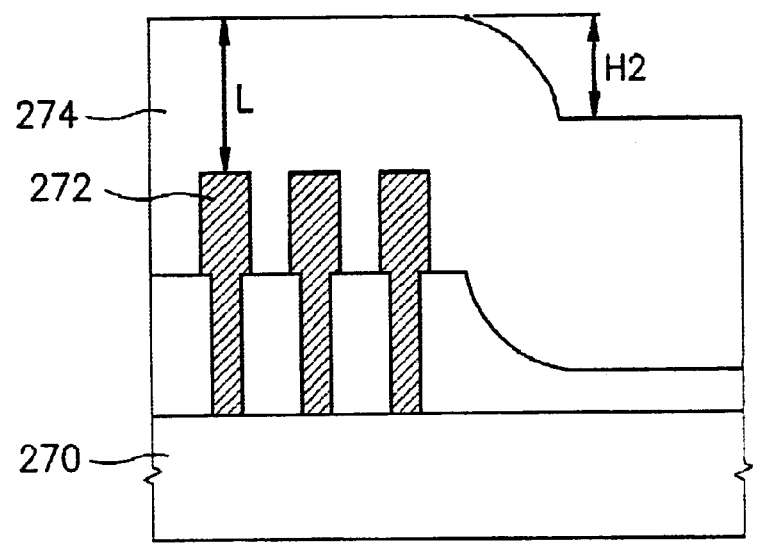

FIG. 25 is a cross-sectional view showing that a first oxide layer 274 used as an interlayer dielectric layer, is formed over the semiconductor substrate 270. Because of the first step-height ($H_1$), the first oxide layer 274 also has a second step-height ($H_2$) between the cell portion (C) and the peripheral portion (P).

The first and second step-heights ($H_1$ and $H_2$) may cause malfunctions in subsequent processes because the step-heights ($H_1$ and $H_2$) make it difficult to exactly focus a photolithography process for the formation of an element pattern.

The first oxide layer 274 is most preferably a BPSG layer, but it is not limited to this material. The first oxide layer 274 is preferably formed by CVD method, and more preferably, by Lower Pressure Chemical Vapor Deposition (LPCVD) method. By this process, a uniform layer can be deposited.

Figure 26:
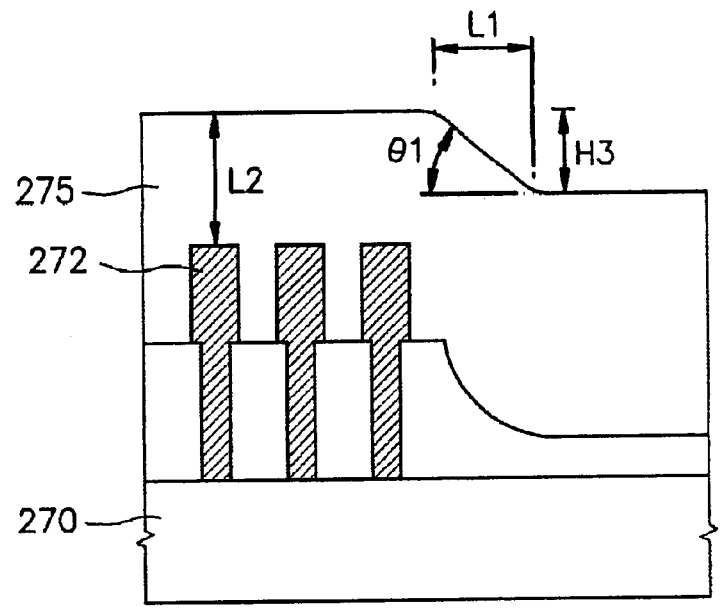

FIG. 26 is a cross sectional view showing that a second oxide layer 275 is formed from a flow-planarized first oxide layer 274. To accomplish this, the first oxide layer 274 is flow-planarized at a high temperature, preferably over 750° C., to minimize the second step-height ($H_2$). After the flow-planarization, the thickness ($L_2$) of the second oxide layer 275 in the cell portion (C) is smaller than a thickness (L) of the first oxide layer 274. In other words, a third step-height ($H_3$) of the second oxide layer 275 is smaller than the second step-height ($H_2$) of the first oxide layer 274. Therefore, the first angle ($\theta_1$) for the formation of the third step-height ($H_3$) is small. However, the high-temperature flow planarization process described above has limitations.

Figure 27:
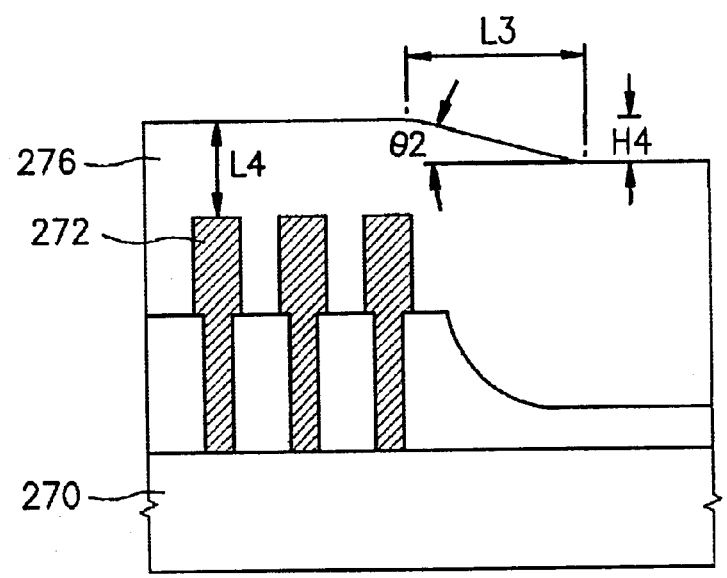

FIG. 27 is a cross sectional view showing that a third oxide layer 276 can be formed by planarizing the second oxide layer 275 using a spin-etch method.

Using this method, a semiconductor substrate 270 having the flow planarized second oxide layer 275 is placed on the spin chuck 212 shown in the FIG. 9. The second oxide layer 275 is then etched by rotating the semiconductor substrate 270 and the spin-chuck 212 and spraying the etching composition through the nozzle 214 onto the semiconductor substrate 270.

In this process, the etching composition preferably has a supply amount of about 0.1 to 2.5 l/min. The etching composition preferably comprises 0.01 to 60 weight percent of $HNO_3$ as an oxidant, 0.05 to 25 weight percent of HF, as an enhancer, and the remainder of deionized water as a buffer solution. More preferably, the etching composition comprises 0.01 to 60 weight percent of $HNO_3$ as an oxidant, 0.5 to 12 weight percent of HF as an enhancer, and the remaining eight percent of deionized water as a buffer solution. The processing temperature is preferably in the range of about 20 to 90° C., more preferably in the range of about 30 to 70° C., and the rotation speed of the spin chuck 212 preferably is in the range of about 200 to 5000 rpm.

The etch rate of the second oxide layer 275 is preferably in the range of about 30 to 52000 Å/min. The processing time is varies depending upon the thickness of the second oxide layer 275, and can be adjusted according to the processing conditions.

Comparing the third oxide layer 276 shown in FIG. 27, which is planarized by the spin-etch method with the second oxide layer 275 of the FIG. 26, the following relationships are true. $H_3 > H_4$, $L_2 > L_4$, $L_1 < L_3$ and $\theta_1 > \theta_2$. As a result, a fourth step-height ($H_4$) and the second angle $\theta_2$ are both minimized by carrying out planarization by the spin-etch method.

The fourth step-height ($H_4$) can be further minimized and the angle $\theta_2$ made smaller when the rotation speed of the spin-chuck is increased The rotation speed has a limitation, however, and so the increased range of the rotation speed is confined by the requirement of sufficient reaction of the etching composition with the second oxide layer 275. The thickness of the second oxide layer 275 removed by the spin-etch is the amount $L_2 - L_4$.

Figure 28:
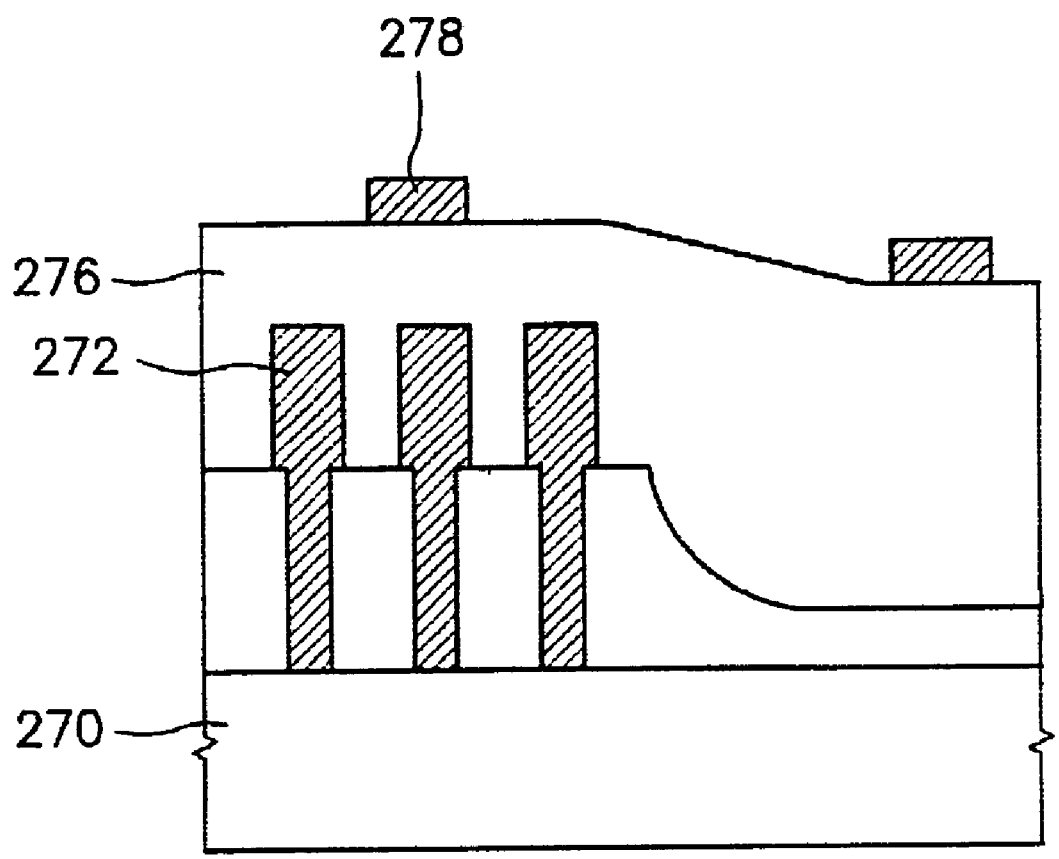

FIG. 28 is a cross sectional view showing that a photoresist pattern 278 is formed over the third oxide layer 276, which is planarized by the spin-etch method. The photoresist pattern 278 is formed after depositing a photoresist over the third oxide layer 276, and carrying out a photolithography process.

By minimizing the step-height ($H_1$) between the upper position and the lower position of the first oxide layer 274, the depth of focus (DOF) in the following photolithography process can be improved.

Studying the effects of the present invention shows several improvements. The conductive plug formation method of the present invention discussed above is characterized in that it is carried out using a spin-etching process by employing an etching composition that has a good reaction with the conductive layer, and by rapidly rotating the semiconductor substrate so as to etch by increasing the etch momentum in the horizontal direction of the semiconductor substrate by means of centrifugal force by the high rotation of the semiconductor substrate. This differs from the conventional CMP method in which a polishing apparatus is contacted with a semiconductor substrate through the application of a certain pressure and the supply of a slurry.

The present invention provides for the formation of a conductive plug that is of sufficient quality even without the planarization step of the interlayer dielectric layer during the formation of the conductive plug, thus improving the productivity of the fabrication process.

In addition, the conductive layer inside the hole-pattern of peripheral portions, such as an align mark and various uneven patterns on the scribe line, is completely removed during the CEP process. This prevents the generation of particles in later processes and the occurrence of microscratches on the semiconductor substrate by the slurry, and as a result, improves the alignability of the photolithography process. According to the present invention, the etch properties can be easily changed by adjusting the rotation speed of the semiconductor substrate, varying the supply amount of the etching composition, changing the spray pressure, altering the boom swing of the nozzle, etc.

Therefore, the present invention achieves the simplification of the semiconductor device fabrication process, the increased reliability of the semiconductor devices, and a reduction of processing expenses.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A method of manufacturing semiconductor devices, comprising:

forming an insulating layer over a semiconductor substrate;

forming contact holes in the insulating layer;

forming a conductive layer over the insulating layer to burying the contact holes;

rotating the semiconductor substrate; and etching the conductive layer by supplying an etching composition on the rotating semiconductor substrate, wherein the etching composition comprises a mixture of at least one oxidant selected from the group consisting of $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group consisting of HF, $NH_4OH$, $H_3PO_4$, $H_2SO_4$, $NH_4F$, and HCl, and a buffer solution, and wherein the oxidant, the enhancer, and the buffer solution have a mixing ratio such that after the etching, the material of the conductive layer is only present inside the contact hole and does not remain over the insulating layer.

2. A method of manufacturing semiconductor devices, as recited in claim 1, wherein the buffer solution comprises a deionized water.

3. A method of manufacturing semiconductor devices, as recited in claim 1, wherein the conductive layer comprises a material selected from the group consisting of tungsten (W), copper (Cu), and polysilicon.

4. A method of manufacturing semiconductor devices, as recited in claim 3, further comprising forming a barrier metal layer over the semiconductor substrate and the insulating layer, after forming contact holes in the insulating layer, but before forming the conductive layer.

5. A method of manufacturing semiconductor devices, as recited in claim 4, wherein the barrier metal layer comprises a material selected from the group of Ti, TiN, Ti/TiN, Ta, TaN, and Ta/TaN.

6. A method of manufacturing semiconductor devices, as recited in claim 1, wherein the etching composition is supplied by a nozzle placed over the semiconductor substrate, the nozzle experiencing boom swing either to the right of center or to the left of center of the semiconductor substrate.

7. A method of manufacturing semiconductor devices, as recited in claim 1, wherein the processing temperature of the etching composition is in the range of 20 to 90° C.

8. A method of manufacturing semiconductor devices, as recited in claim 7, wherein the semiconductor substrate is heated to about the processing temperature of the etching composition.

9. A method of manufacturing semiconductor devices, as recited in claim 3, wherein the etching composition comprises 0.01 to 30 weight percent of $HNO_3$, as an oxidant, 0.01 to 30 weight percent of $NH_4F$ as an enhancer, and a remaining weight percent of deionized water.

10. A method of manufacturing semiconductor devices, as recited in claim 3, wherein the etching composition comprises 3 to 55 weight percent of $HNO_3$, as an oxidant, 0.2 to 35 weight percent of HF, as an enhancer, and a remaining weight percent of deionized water.

11. A method of manufacturing semiconductor devices, as recited in claim 3, wherein the etching composition comprises 0.2 to 30 weight percent of $H_2O_2$, as an oxidant, 0.01 to 30 weight percent of $NH_4OH$, as an enhancer, and a remaining weight percent of deionized water.

12. A method of manufacturing semiconductor devices, as recited in claim 3, wherein the etching composition comprises 3 to 60 weight percent of $HNO_3$, as an oxidant, 0.06 to 30 weight percent of HF, as an enhancer, and a remaining weight percent of deionized water.

13. A method of manufacturing semiconductor devices as recited in claim 1, wherein the etching of the conductive layer is carried out by at least two etching processes.

14. A method of manufacturing semiconductor devices comprising the steps of:

forming a pattern structure over a semiconductor substrate;

forming an interlayer dielectric layer over the semiconductor substrate and the pattern structure;

rotating the semiconductor substrate; and etching the interlayer dielectric layer by supplying on the rotating semiconductor substrate an etching composition comprising a mixture of at least one oxidant selected from the group consisting of $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group consisting of HF, $NH_4OH$, $H_3PO_4$, $H_2SO_4$, $NH_4F$, and HCl, and a buffer solution, wherein the oxidant, enhancer, and buffer solution are mixed in a certain mixing ratio such that the etching planarizes the interlayer dielectric layer.

15. A method of manufacturing semiconductor devices, as recited in claim 14, wherein the interlayer dielectric layer comprises a material selected from the group consisting of an oxide, a nitride, borophosphosilicate, and tetraethylorthosilicate.

16. A method of manufacturing semiconductor devices, as recited in claim 15, wherein the etching composition comprises 0.01 to 60 weight percent of $HNO_3$, as an oxidant, 0.05 to 25 weight percent of HF as an enhancer, and a remaining weight percent of deionized water.

17. A method of manufacturing semiconductor devices, as recited in claim 15, wherein the etching composition comprises 0.01 to 30 weight percent of $HNO_3$ as an oxidant, 0.01 to 30 weight percent of $NH_4F$ as an enhancer, and a remaining weight percent of deionized water.

18. A method of manufacturing semiconductor devices, as recited in claim 14, wherein the rotation speed of the semiconductor substrate is between 200 to 5000 rotations per minute.

19. A method of manufacturing semiconductor devices, as recited in claim 14, wherein the etching composition is supplied by a nozzle placed over the semiconductor substrate, the nozzle experiencing boom swing either to the right of center or to the left of center of the semiconductor substrate.

20. A method of manufacturing semiconductor devices, as recited in claim 19, wherein the boom swing comprises long distance boom swing and short distance boom swing, which are carried out sequentially.

21. A method of manufacturing semiconductor devices, as recited in claim 14, wherein the semiconductor substrate is heated to about the processing temperature of the etching composition.

22. A method of manufacturing semiconductor devices comprising:

forming an insulating layer over a semiconductor substrate;

forming contact holes in the insulating layer;

forming a covering layer over the insulating layer to bury the contact holes;

rotating the semiconductor substrate;

heating the semiconductor substrate by supplying hot gas to the back side of the semiconductor substrate; and etching the covering layer by supplying an etching composition on the rotating semiconductor substrate, wherein the material of the covering layer is only present inside the contact hole and does not remain over the insulating layer after the etching.

23. A method of manufacturing semiconductor devices, as recited in claim 22, wherein the etching composition comprises a mixture of at least one oxidant selected from the group consisting of $H_2O_2$, $O_2$, $IO_4^-$, $BrO_3$, $ClO_3$, $S_2O_8^-$, $KIO_3$, $H_5IO_6$, KOH, and $HNO_3$, at least one enhancer selected from the group consisting of HF, $NH_4OH$, $H_3PO_4$, $H_2SO_4$, $NH_4F$, and HCl, and a buffer solution.

24. A method of manufacturing semiconductor devices, as recited in claim 23, wherein the buffer solution comprises deionized water.

25. A method of manufacturing semiconductor devices, as recited in claim 22, wherein the covering layer comprises a conductive layer or an interlayer dielectric layer.

26. A method of manufacturing semiconductor devices, as recited in claim 22, wherein the hot gas comprises an inert gas, and the temperature of the hot gas is in the range of 20° C. to 90° C.

27. A method of manufacturing semiconductor devices, as recited in claim 22, wherein the etching composition is supplied by a nozzle placed over the semiconductor substrate, the nozzle experiencing boom swing either to the right of center or to the left of center of the semiconductor substrate.

28. A method of manufacturing semiconductor devices, as recited in claim 22, wherein the processing temperature of the etching composition is in the range of 20° C. to 90° C.

* * * * *